United States Patent [19]

Kojima et al.

[11] 3,801,364

[45] Apr. 2, 1974

[54] METHOD FOR MAKING PRINTED CIRCUITS WHICH INCLUDE PRINTED RESISTORS

[75] Inventors: Kunio Kojima; Kazuyuki Shimada; Mitsuo Wada, all of Osaka, Japan

[73] Assignee: Matsushita Electric Industrial Co., Ltd., Osaka, Japan

[22] Filed: Jan. 21, 1972

[21] Appl. No.: 219,667

[30] Foreign Application Priority Data

Feb. 3, 1971 Japan .................................. 46-4399

Feb. 9, 1971 Japan .................................. 46-5754

[52] U.S. Cl. .............. 117/212, 117/130 E, 117/217

[51] Int. Cl. .......................... C23c 17/00, B44d 1/18

[58] Field of Search ........ 117/212, 217, 130 E, 218, 117/227; 317/101

[56] References Cited

UNITED STATES PATENTS

| | | | |
|---|---|---|---|
| 3,714,709 | 2/1973 | Liederbach | 117/212 |
| 3,625,758 | 12/1971 | Stahl et al. | 117/217 |
| 3,619,233 | 11/1971 | Hipp et al. | 117/217 |
| 3,493,369 | 2/1970 | Busch et al. | 117/218 |

*Primary Examiner*—Ralph S. Kendall

*Assistant Examiner*—J. Massie

*Attorney, Agent, or Firm*—Wenderoth, Lind & Ponack

[57] ABSTRACT

A method for making printed circuits which include printed resistors. A conductive paste is provided which has noble metal particles in flake form and metal particles in dendrite form dispersed in a thermosetting resin. This paste is applied to an insulating base in a desired circuit pattern and cured to adhere the conductive paste tightly to the insulating base and form a conductive film in the desired circuit pattern. A resistor paste is applied in a desired pattern to the insulating base so that the resistor paste connects at both ends of the pattern to parts of the conductive film, and the resistor paste is cured to cause it to adhere tightly to said insulating base and form a resistor film. The resistor film is covered by an insulating film, and the insulating base with the films thereon is immersed in an electroless metal deposition bath for electrolessly depositing metal only on exposed portions of the conductive film.

9 Claims, 4 Drawing Figures

METHOD FOR MAKING PRINTED CIRCUITS WHICH INCLUDE PRINTED RESISTORS

The present invention relates to a method for making printed circuits which include printed resistors prepared by curing conductive paste and resistor paste applied to an insulating base.

There have been known various kinds of printed circuits such as copper clad lamination board, copper powder adhesion board and electroless deposited copper board described in, for example, U.S. Pat. No. 3,146,125. These boards are widely used as printed circuits and each has its own advantages. However, it is rather difficult to superpose printed resistors on these printed circuits because printed resistors which usually have fine carbon particles dispersed in a resinous binder are in a poor electric-contact with these printed circuits. The poor electric-contact is attributed to a copper oxide layer formed on these circuits. Therefore, it is possible to improve such poor electric-contact by using silver instead of copper. However, the use of silver makes the resultant cost higher.

Another possible method for making a printed circuit combined with printed resistors is to form a printed circuit by applying silver paint to an insulating base. The conventional silver paint has silver particles dispersed in a vehicle in which resinous binding material is dissolved and forms a conductive film upon curing. However, it is difficult for conventional silver paint to produce a conductive film having both a high surface electric conductivity and a high strength of adhesion to an insulating base. A greater amount of silver particles results in a higher surface electric conduction but in a poorer adhesion strength and vice versa.

An object of this invention is to provide a method for making printed circuits which include printed circuits which include printed resistors, the conductive parts of said printed circuits being in a good electric-contact with said printed resistors and having a high strength of adhesion to an insulating base.

This object is accomplished by providing a method for making printed circuits which include printed resistors, in which method the following steps are carried out in the recited order. First a conductive paste is provided which has noble metal particles in flake form and metal particles in dendrite form dispersed in a thermosetting resin. This paste is applied to an insulating base in a desired circuit pattern and cured to adhere the conductive paste tightly to the insulating base and form a conductive film in the desired circuit pattern. A resistor paste is applied in a desired pattern to the insulating base so that the resistor paste connects at both ends of the pattern to parts of the conductive film, and the resistor paste is cured to cause it to adhere tightly to said insulating base and form a resistor film. The resistor film is covered by an insulating film, and the insulating base with the films thereon is immersed in an electroless metal deposition bath for electrolessly depositing metal only on exposed portions of the conductive film.

Other and further features of this invention will be apparent upon consideration of following detailed description taken together with the accompanying drawings wherein.

Figure 3:
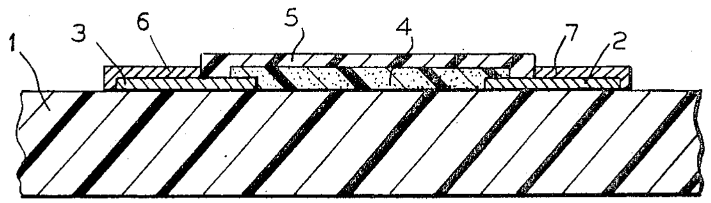
Figure 4:
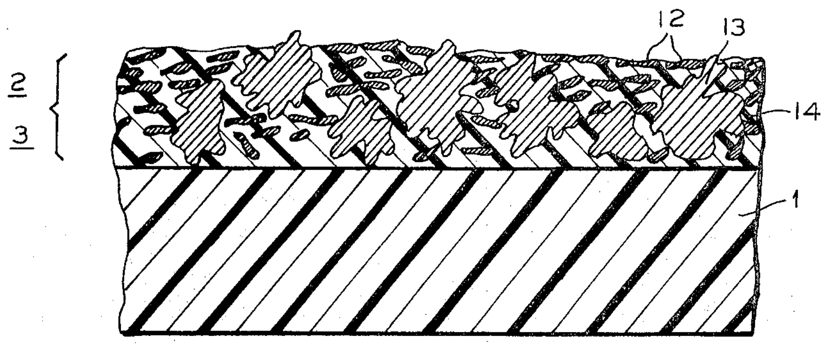

FIG. 3 is a cross-sectional view of a printed circuit which includes a resistor film and wherein the conductive film constituting said printed circuit is covered with electroless plating metal film and said resistor film is covered with an insulating film; and FIG. 4 is a cross-sectional view of a conductive film for use in a printed circuit which includes a resistor film in accordance with the present invention.

Figure 1:
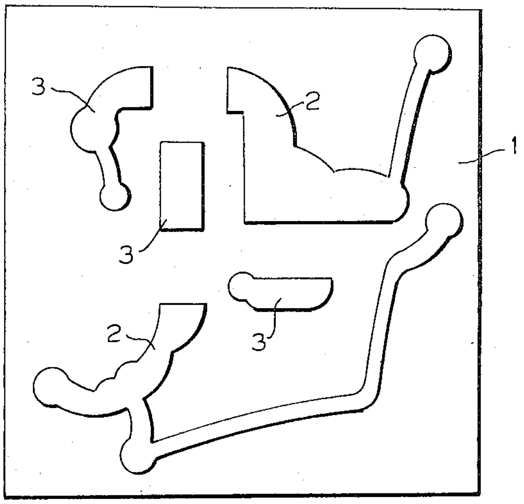
FIG. 1 is a plan view of a printed circuit in a given pattern composed of conductive films.

A process for making printed circuits which include printed resistors according to the present invention will be described with reference to FIGS. 1, 2 and 3 wherein similar reference characters designate components similar to each other. A conductive paste which will be described in detail hereinafter is applied to an insulating base 1 such as a phenol resin plate, an epoxy resin plate or a glass plate in a desired pattern.

The conductive paste on the insulating base 1 is cured at a suitable temperature to form conductive films 2 and 3 in a given pattern in which the films are spaced from each other. The conductive films 2 and 3 adhere firmly to the insulating base 1 due to the thermosetting binding material included in the conductive paste. Any available and suitable resistor paste having conductive powder such as carbon black and/or graphite powder dispersed in a vehicle including thermosetting binding resin is then applied in a desired pattern to the insulating base 1 so as to bridge the space between the two conductive films 2 and 3 at desired positions. The resistor paste can be applied by any suitable and available method such as a screen printing method. The cured resistor paste forms resistor films 4 adhered firmly to the insulating base 1 and to the conductive films 2 and 3 at the desired positions.

Each resistor film 4 is covered with an insulating film 5 formed by applying varnish including an organic resin such as epoxy resin which is inert to an electroless metal deposition bath composition, and by curing the varnish at a temperature lower than that for curing the resistor paste. The resultant insulating base 1 is immersed in an electroless metal deposition bath so that the conductive films 2 and 3 are covered with electrolessly deposited metal layers 6 and 7 at the exposed portions having no insulating film 5 thereover.

The conductive films 2 and 3 can be prepared by any available and suitable conductive paste having a noble metal powder such as silver, gold or platinum dispersed in a vehicle including a thermosetting binding resin. The conventional conductive paste produces conductive films which have poor surface electric conductivity when it includes a large amount of thermosetting binding resin relative to metal powder. On the other hand, the use of conductive paste including a large amount of metal powder results in a conductive film having a poor strength of adhesion to an insulating base. According to the present invention it is necessary to use a conductive film having both a high surface electric conductivity and a high strength of adhesion to an insulating base. Such a film can be provided by using conductive paste having noble metal powder in a flake form and metal powder in a dendrite form dispersed in a vehicle including thermosetting resin. The noble metal powder referred to herein is of a metal such as silver, gold or platinum which is not oxidized by oxygen.

Referring to FIG. 4, reference numeral 1 designates an insulating base such as phenol, epoxy, a resin plate or a glass plate. Conductive films 2 and 3 adhere firmly to said insulating base 1 and have flake metal powder 12 and dendrite metal powder 13 dispersed in a thermosetting resin binder 14. The metal powder 12 in flake form is distributed more densely at the top portion of said conductive films 2 and 3, and dendrite metal particles 13 are distributed uniformly in said conductive film 2 and 3. The particles of metal powder in flake form are about 1 to 10 microns in diameter as measured across the flat surface and about 0.01 to 0.1 microns in thickness.

The diameter of the particles of metal powder is measured by electron microphotographs obtained by well known methods. The thickness is measured by electron microphotographs obtained by a conventional shadow case method in which chromium metal or carbon is evaporated at an inclined angle to the sample powder and is deposited on the surface of the sample powder. According to this method, the sample powder has a portion having no chromium metal or carbon deposited thereon. The electron microphotographs reveal a white portion. The thickness is calculated from the length of the white portion and the size of the inclined angle as reported in "shadow casting and surface replication" of chap. 13 in the book of "Vacuum deposition of Thin Films" by L. Holland, 1960.

The metal powder in a flake form preferably satisfies the sedimentation test described below. A glass dish 100 mm in diameter and in 30 mm deep is filled with butyl alcohol. 0.5 gr. of metal powder is caused to fall on the surface of the butyl alcohol through a 325 mesh sieve. The particles of metal powder are separated into two groups; one floats on the surface of the butyl alcohol and the other sediments on the bottom of the glass dish. The floating powder is transferred to a beaker by a decantation method after being kept still for one minute and is dried. The weight ratio of floating powder to sedimented powder is hereinafter called the floating ratio. A preferred metal powder in flake form has a floating ratio of more than 60 percent.

The metal powder in dendrite form makes the conductive film mechanically stronger and thermally more stable. Operable average particle sizes of said metal powder in dendrite form range from 10 to 15 microns.

The conductive film includes 10 to 60 wt. percent of metal particles in flake form and 40 to 90 wt. percent of metal powder in dendrite form. The composition of said conductive film is 10 to 50 percent by volume of thermosetting binder and 50 to 90 percent by volume of the total amount of said metal powder in flake form and said metal powder in dendrite form.

It is preferred that the metal particles in flake form consist essentially of silver. It is preferred that the metal powder in dendrite form consist essentially of copper and iron. A combination of silver powder in flake form and copper powder in dendrite form produces a conductive film having superior electrical conductivity, mechanical strength and stability.

Said thermosetting binder consists essentially of a resin selected from the group consisting of phenol, xylene, urea, epoxy and modified phenol resin.

Said metal powder in flake form can be prepared by any suitable and available crushing machine such as a ball mill, stamp mill and vibration mill. The choice of crushing machine must be made by taking into account the brittleness of the starting materials. Silver powder in flake form is preferably prepared by using a ball mill, when electrolytic silver powder is used as a starting material. It is important for the preparation of metal particles in flake form that 1 to 20 weight percent of fatty acid such as stearic acid be added to the metal powder in the crushing machine. The fatty acid prevents the particles of metal powder in the crushing machine from oxidizing and adhering to each other. In addition, the use of fatty acid produces metal powder in flake form coated with a thin film of fatty acid which improves greatly the aforesaid floating ratio.

Said metal powder in dendrite form consists of so-called electrolytic metal powder which is obtained by electrolytic deposition which is well known in electrochemistry.

The metal powder in flake form and metal powder in dendrite form are dispersed in a liquid vehicle which is a solution of a thermosetting binder in a solvent in order to prepare the conductive paste. The dispersion can be achieved by any suitable and available method such as a three roller mill and a ball mill. The consistency of said conductive paste is preferably adjusted in accordance with the method to be used in applying it. Such methods of application include a spray method, a dip method, a brush method and a screen stencil method. For example, the screen stencil method requires the conductive paste to have a viscosity of 500 to 2,000 poises.

The conductive paste to produce a given composition of a resultant conductive film is applied to an insulating base. The conductive paste on the insulating base is cured at a temperature depending upon the thermosetting resin in the conductive paste and is formed into a conductive film. The thickness of the conductive film can vary depending on its purpose and can range from 15 to 50 microns.

The electrolessly deposited metal layers 6 and 7 are preferably composed of copper and can be achieved by a conventional method well known in the art. However, it is necessary to adjust the pH value of the electroless copper deposition bath composition so that it is from 9 to 13 when the metal powder in flake form is used in the conductive films 2 and 3. It has been discovered according to the present invention that this adjustment of the pH value results in an electrolessly deposited copper layers 6 and 7 which are adhered firmly to the conductive films 2 and 3.

The electrolessly deposited metal layers 6 and 7 superposed on the conductive films 2 and 3 have various advantages; a higher electric conductivity, a better soldering action, and a higher stability with respect to humidity. A preferred structure of said improved conductive film is one in which the electrolessly deposited metal films 6 and 7 consist of copper and said conductive films 2 and 3 have silver particles in flake form and copper particles in dendrite form dispersed in a thermosetting binder.

The following examples are exemplary embodiments of this invention and should not be construed as limitative.

EXAMPLE

Electrolytic silver powder having an average particle size of 10 microns is admixed with 5 wt. percent of stearic acid and pulverized in a stamp mill for 10 hours and subsequently in a ball mill for 5 days with the further addition of 5 wt. percent of stearic acid.

100 gr. of silver powder is put in 100 cc. of methyl alcohol at room temperature and stirred for 1 hour. The washed silver powder is dried at 120°C for 3 hours. The thus obtained silver powder is coated with a thin layer of stearic acid. The existence of the thin layer of stearic acid is established by the following method. 10 gr. of dried silver powder is cleaned with 50 cc. of boiling methyl alcohol in a refulx condenser for 1 hour. The boiled methyl alcohol has an acid value of 3.0 which proves the existence of stearic acid in the methyl alcohol.

The silver powder in flake form has a diameter of about 3 microns as measured across the flat surface and is about 0.03 microns thick as measured by the above described electron microphotographs. The floating ratio of this silver powder is 75 wt. percent.

The silver powder in flake form has a diameter of about 3 microns as measured across the flat surface and is about 0.03 microns thick as measured by the above described electron microphotographs. The floating ratio of this silver powder is 75 wt. percent.

Copper powder in dendrite form is obtained by an electrolytic deposition method and is about 12 microns in diameter. The mixing proportions of silver powder in flake form and copper powder in dendrite form are 35 wt% and 65 wt%, respectively. The resultant conductive film has a surface electric resistivity of 0.3 ohm/sq. cm.

The silver powder and the copper powder are dispersed well in a vehicle including 40 wt.% of phenol resin as a thermosetting binder and 60 wt.% of carbitol by using a three roller mill. The thus obtained conductive paste has 20 % by volume of phenol resin and 80 % by volume of silver and copper powder when the carbitol is evaporated off. The conductive paste is applied to an epoxy resin plate by a 160 mesh stencil screen and is cured at 180°C for 5 minutes. The cured paste forms a conductive film having a thickness of 25 microns. The surface of said conductive film is predominantly silver powder in flake form and has a bright silver appearance.

Figure 2:
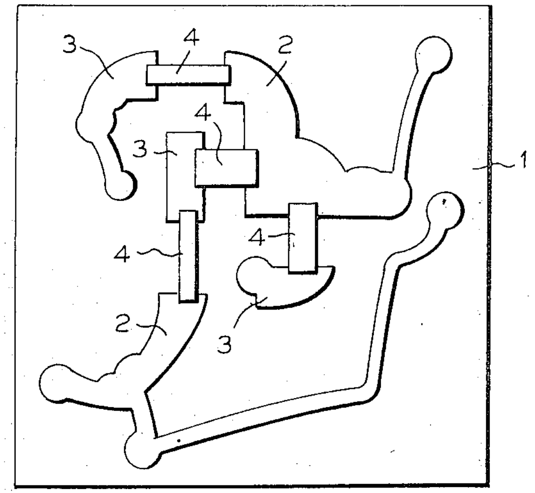
FIG. 2 is a plan view of a printed circuit having a resistor film superposed thereon.

A resistor paste is applied to said insulating base by a 200 mesh screen stencil and is formed into a pattern to bridge said conductive films as shown in FIG. 2. The resistor paste has finely divided acetylene black particles dispersed in a vehicle consisting of 60 weight % of benzyl alcohol and 40 weight % of xylene modified phenol resin as a thermosetting binder. The applied resistor paste is cured at 180°C for 5 minutes and is formed into a resistor film consisting of 22.5 weight % of acetylene black particles and 77.5 weight % of xylene modified phenol resin. The thus produced resistor film has a thickness of 20 microns and a surface resistivity of 3 kilo-ohm/sq. cm.

The resistor film is coated with an over-coating film which is prepared by curing an over-coating paste consisting of 75 weight % of fine powdered silica, 20 weight % of epoxy resin of a thermosetting type and 5 weight % of ferrocyan blue. The over-coating paste is applied to the resistor film in a way similar to the way the resistor paste is applied and is cured at 160°C for 5 minutes. The over-coating film has a thickness of about 30 microns.

The resultant insulating base is immersed in an electroless copper plating bath for 3 hours in order to coat the conductive film with an electroless by deposited copper layer. The electroless copper plating bath is an aqueous solution having a composition of 30 g/L of copper sulfate, 30 g/L of sodium carbonate, 100 g/L of Rochelle salt, 50 g/L of sodium hydroxide and 30 ml/L of formaline (37% concentration). The aqueous solution has a pH value of 11.5. The electroless deposited copper layer has a thickness of about 10 microns.

A copper wire 0.8 mm in diameter is soldered to the electrolessly deposited copper layer. When the copper wire is pulled by a force of 5 kg/cm$^2$ in a direction perpendicular to the insulating base, the conductive film does not come off the insulating base. The pulling strength does not change after the resultant insulating base is tested at 40°C for 500 hours at a relative humidity of 95%. The resistor film has a noise level of −15 dB and is in a good contact with the conductive film. The electrical resistance of the resistor film changes by 2% after the above humidity test.

What is claimed is:

1. A method for making printed circuits which include printed resistors, which comprises the following steps in the recited order; providing conductive paste having noble metal particles in flake form in an amount of 10 to 60 wgt. % of the total weight of metal particles and metal particles in dendrite form in an amount of 40 to 90 wgt. % of the total weight of metal particles dispersed in a thermosetting binder; applying said conductive paste to an insulating base in a desired circuit pattern; curing said conductive paste whereby said conductive paste adheres tightly to said insulating base and forms a conductive film in the desired circuit pattern; applying resistor paste in a desired pattern to said insulating base so that said resistor paste connects at both ends of said pattern to parts of said conductive film; curing said resistor paste to cause it to adhere tightly to said insulating base and said parts of said conductive film and to form a resistor film in the desired pattern; covering said resistor film firmly with an insulating film; and immersing the insulating base with the films thereon in an electroless metal deposition bath for electrolessly depositing metal only on exposed portions of said conductive film.

2. A method for making printed circuits as claimed in claim 1, wherein said noble metal particles in flake form have a flat surface with a diameter of 1 to 10 microns and said metal particles in dendrite form have an average particle size of 10 to 15 microns.

3. A method for making printed circuits as claimed in claim 1, wherein said conductive film has a composition consisting essentially of 10 to 50 % by volume of said thermosetting binder and 50 to 90 % by volume of metal particles in flake form and dendrite form.

4. A method for making printed circuits as claimed in claim 1, wherein said noble metal particles in flake form consist essentially of silver and said metal particles in dendrite form consist essentially of copper.

5. A method for making printed circuits as claimed in claim 1, wherein said electroless metal deposition bath has a pH value of 9 to 13.

6. A method for making printed circuits as recited in claim 1 wherein said noble metal particles in flake form are distributed more densely at the top portion of said conductive film than at the bottom portion thereof and said metal particles in dendrite form are distributed substantially uniformly throughout said conductive film.

7. A method for making printed circuits as recited in claim 6 wherein said noble metal particles in flake form have a flat surface with a diameter of 1 to 10 microns and are present in an amount of 10 to 60 wt.% of the total weight of metal particles, and said metal particles in dendrite form have an average size of 10 to 15 microns and are present in an amount of 40 to 90 wt.% of the total weight of metal particles.

8. A method for making printed circuits as recited in claim 7 wherein said conductive film has a composition consisting essentially of 10 to 50% by volume of said thermosetting binder and 50 to 90% by volume of metal particles in flake form and dendrite form.

9. A method for making printed circuits as claimed in claim 8 wherein said noble metal particles in flake form consist essentially of silver and said metal particles in dendrite form consist essentially of copper.

* * * * *